(12) United States Patent
Neumann et al.

(10) Patent No.: US 7,612,689 B2
(45) Date of Patent: Nov. 3, 2009

(54) ROTARY ENCODING SWITCH

(75) Inventors: Siegfried Neumann, Kümmersbruck (DE); Uwe Weiss, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 123 days.

(21) Appl. No.: 11/922,493

(22) PCT Filed: Jun. 20, 2005

(86) PCT No.: PCT/DE2005/001097

§ 371 (c)(1),
(2), (4) Date: Dec. 19, 2007

(87) PCT Pub. No.: WO2006/136120

PCT Pub. Date: Dec. 28, 2006

(65) Prior Publication Data

US 2009/0135028 A1    May 28, 2009

(51) Int. Cl.
*H03M 1/22* (2006.01)
(52) U.S. Cl. ............... 341/11; 341/4; 341/10; 341/15; 341/16; 341/17; 250/231.13; 250/231.14; 250/231.17; 250/231.18
(58) Field of Classification Search ............ 341/4, 341/10, 11, 15, 16, 17; 250/213.13–213.18
See application file for complete search history.

(56) References Cited

U.S. PATENT DOCUMENTS

| | | | |
|---|---|---|---|
| 3,187,318 A | | 6/1965 | Chapman |
| 3,196,431 A | | 7/1965 | Papelian |
| 3,432,847 A | * | 3/1969 | Eccles et al. .................. 341/16 |
| 3,680,079 A | | 7/1972 | Hedges |
| 4,135,065 A | * | 1/1979 | Nicot .................... 200/11 DA |
| 4,163,879 A | * | 8/1979 | Mayer et al. ........... 200/11 TW |
| 4,567,467 A | | 1/1986 | Leskovec |
| 4,945,231 A | * | 7/1990 | Ohya et al. ............ 250/231.14 |
| 5,006,703 A | * | 4/1991 | Shikunami et al. ..... 250/231.13 |
| 5,418,341 A | * | 5/1995 | Sato ........................ 200/11 R |
| 5,602,388 A | * | 2/1997 | Maenza ................. 250/231.13 |
| 6,124,589 A | * | 9/2000 | West ..................... 250/231.14 |
| 6,411,376 B1 | * | 6/2002 | Southam et al. .......... 356/237.1 |

(Continued)

FOREIGN PATENT DOCUMENTS

DE    19 803 661 A1    8/1999

(Continued)

OTHER PUBLICATIONS

G A Woolvet: Digital transducers. Journal of physics e. scientific instruments, IOP publishing, Bristol, GB; Bd.15, Nr.12, 1982, S.1271-1280, XP002055470, ISSN: 0022-2735; Others; 1982.

(Continued)

*Primary Examiner*—Linh V Nguyen
(74) *Attorney, Agent, or Firm*—Harness, Dickey & Pierce, P.L.C.

(57) ABSTRACT

In one embodiment of the present invention, a rotary encoding switch is disclosed such as used in the function setting for relays or similar. In one embodiment, a particularly secure function setting for relays or similar may be achieved by means of a rotary encoding switch with a number of switch stages with separations between the switch stages which are not constant.

10 Claims, 4 Drawing Sheets

U.S. PATENT DOCUMENTS

| | | | | |
|---|---|---|---|---|
| 6,448,518 | B1 * | 9/2002 | Martin et al. | 200/292 |
| 6,653,620 | B2 * | 11/2003 | Blasing et al. | 250/231.13 |
| 6,784,417 | B2 * | 8/2004 | Sonoki | 250/231.13 |
| 7,022,975 | B2 * | 4/2006 | Horton | 250/231.14 |

FOREIGN PATENT DOCUMENTS

| DE | 19803661 A1 | 8/1999 |
|---|---|---|
| WO | PCT/ISA/210 | 9/2005 |

OTHER PUBLICATIONS

Peter Khairolomour: Rotary encoder mates with digital potentiometer, Electrical Design News, Rogers Pub. Co., Englewood, Colo, US. Bd.48, Nr.5, 6. März 2003, S. 124,126, XP 001160008, ISSN: 0012-7515.

* cited by examiner

FIG 4

| | 1 | 2 | 4 | 8 | 16 | 32 |
|---|---|---|---|---|---|---|
| 0 | | | | | | |
| 1 | • | | | | | |
| 2 | | • | | | | |
| 3 | • | • | | | | |
| 4 | | | • | | | |
| 5 | • | | • | | | |
| 6 | | • | • | | | |
| 7 | • | • | • | | | |
| 8 | | | | • | | |
| 9 | • | | | • | | |
| 10 | | • | | • | | |
| 11 | • | • | | • | | |
| 12 | | | • | • | | |
| 13 | • | | • | • | | |
| 14 | | • | • | • | | |
| 15 | • | • | • | • | | |
| 16 | | | | | • | |
| 17 | • | | | | • | |
| 18 | | • | | | • | |
| 19 | • | • | | | • | |
| 20 | | | • | | • | |
| 21 | • | | • | | • | |
| 22 | | • | • | | • | |
| 23 | • | • | • | | • | |
| 24 | | | | • | • | |
| 25 | • | | | • | • | |
| 26 | | • | | • | • | |
| 27 | • | • | | • | • | |
| 28 | | | • | • | • | |
| 29 | • | | • | • | • | |
| 30 | | • | • | • | • | |
| 31 | • | • | • | • | • | |
| 32 | | | | | | • |
| 33 | • | | | | | • |
| 34 | | • | | | | • |
| 35 | • | • | | | | • |
| 36 | | | • | | | • |
| 37 | • | | • | | | • |
| 38 | | • | • | | | • |
| 39 | • | • | • | | | • |
| 40 | | | | • | | • |
| 41 | • | | | • | | • |
| 42 | | • | | • | | • |
| 43 | • | • | | • | | • |
| 44 | | | • | • | | • |
| 45 | • | | • | • | | • |
| 46 | | • | • | • | | • |
| 47 | • | • | • | • | | • |
| 48 | | | | | • | • |
| 49 | • | | | | • | • |
| 50 | | • | | | • | • |
| 51 | • | • | | | • | • |
| 52 | | | • | | • | • |
| 53 | • | | • | | • | • |
| 54 | | • | • | | • | • |
| 55 | • | • | • | | • | • |
| 56 | | | | • | • | • |
| 57 | • | | | • | • | • |
| 58 | | • | | • | • | • |
| 59 | • | • | | • | • | • |
| 60 | | | • | • | • | • |
| 61 | • | | • | • | • | • |
| 62 | | • | • | • | • | • |
| 63 | • | • | • | • | • | • |

ROTARY ENCODING SWITCH

PRIORITY STATEMENT

This application is the national phase under 35 U.S.C. § 371 of PCT International Application No. PCT/DE2005/001097 which has an International filing date of Jun. 20, 2005, which designated the United States of America, the entire contents of which are hereby incorporated herein by reference.

FIELD

At least one embodiment of the invention generally relates to a rotary encoding switch as is used, for example, to set the functions in relays or the like.

BACKGROUND

The use of resistance potentiometers to set a wide variety of parameters, for example current, voltage or time, is known. In the case of resistance potentiometers, an analog change in resistance is tapped off and can be used directly in analog circuits, for example to change the gain. In the case of digital circuits, the analog change in resistance is read in with the aid of an analog/digital converter, for example, and is then processed. Although a resistance potentiometer in theory has an infinitely fine setting, a value can actually be set only with a limited level of accuracy on account of non-linearities, mechanical tolerances, reading inaccuracies etc. Therefore, complicated and expensive adjustment of the setting is generally necessary in the case of resistance potentiometers.

The prior art discloses a multiplicity of encoders. For example, the patent specifications U.S. Pat. Nos. 4,567,467 3,196,431, 3,187,318 and the patent application DE 198 03 661 A1 thus exhibit different encoders for signal coding. However, none of these encoders is used to set the functions in relays or the like.

SUMMARY

In at least one embodiment of the present invention, it is possible to set the functions in relays or the like in a particularly reliable manner.

In at least one embodiment of the invention, a rotary encoding switch includes an encoder disk which is in the form of a rotary disk and includes at least 64 switching stages, the distances between the switching stages on the encoder disk not being constant but rather changing continuously, namely logarithmically, such that the distances between the switching stages decrease starting from the switching stages which are assigned low setting values to the switching stages which are assigned high setting values.

A basic idea of at least one embodiment of the invention is to use distances, which are not constant, between the setting positions of the rotary encoding switch to reduce the percentage error when setting a particular setting value and thus to increase the relative setting accuracy. There is no need for complicated and expensive adjustment. In other words, such a rotary encoding switch makes it possible for the first time to replace a resistance potentiometer with another technical solution in which a comparable level of setting accuracy is achieved without complicated adjustment.

A high coding resolution is achieved using a large number of switching stages. In this context, a rotary encoding switch having sixty four switching stages has proved to be particularly advantageous.

The encoder disk is in the form of a rotary disk, with the result that virtually continuous setting is possible, as is customary with resistance potentiometers.

According to at least one embodiment of the invention, the distances between the switching stages change continuously, in particular become increasingly small. In other words, the distance decreases from one switching stage to the next. This makes it possible to achieve a constant percentage error over the entire settable scale of the rotary encoding switch. It is particularly advantageous if the distances between the individual switching stages decrease logarithmically in this case.

In other words, a logarithmic distribution of the switching stages over the encoder disk of the rotary encoding switch then results. It is quite particularly advantageous if the distances decrease starting with the switching stages which are assigned to low setting values to the switching stages which are assigned to high setting values.

However, in the case of such a configuration of the switching stages, the distances between the switching stages become so small (in particular in the case of relatively high setting values) that a binary code can no longer be realized with "break before make". "Break before make" indicates that all closed switching contacts must first of all open before the switching contacts to be closed are allowed to close. However, "break before make" is necessary for reasons of safety in order to avoid impermissible intermediate positions which may result in dangerous settings. In such intermediate positions between two switching stages, the rotary encoding switch may knowingly or unknowingly catch. This may result in malfunctions. One example embodiment of the invention remedies this by using a Gray code as the coding. A change of 1 bit thus respectively results when rotating from one position n to a next position n+1 or n−1, with the result that no dangerous intermediate positions can occur.

If fixed mechanical latch positions are also dispensed with, continuous "spinning" of the rotary encoding switch is made possible, which gives the user a sense of control which is equivalent to that of a resistance potentiometer. In other words, the user can set the desired value "in an infinitely variable manner", as he is accustomed to from a resistance potentiometer.

In summary, in at least one embodiment, a rotary encoding switch which has a high resolution with sixty four switching stages, an encoder disk in the form of a rotary disk and preferably a Gray code as the coding as well as a lack of mechanical latching positions is proposed. Such a rotary encoding switch combines the most important features for achieving particularly user-friendly operation but without being tied to a special configuration of the switching stages, for example changing distances between the switching stages.

BRIEF DESCRIPTION OF THE DRAWINGS

The invention is described in more detail below using an example embodiment which is explained with the aid of the figures, in which:

FIG. 4 shows a table with an illustration of the Gray code for sixty four stages.

DETAILED DESCRIPTION OF THE EXAMPLE EMBODIMENTS

Figure 1:
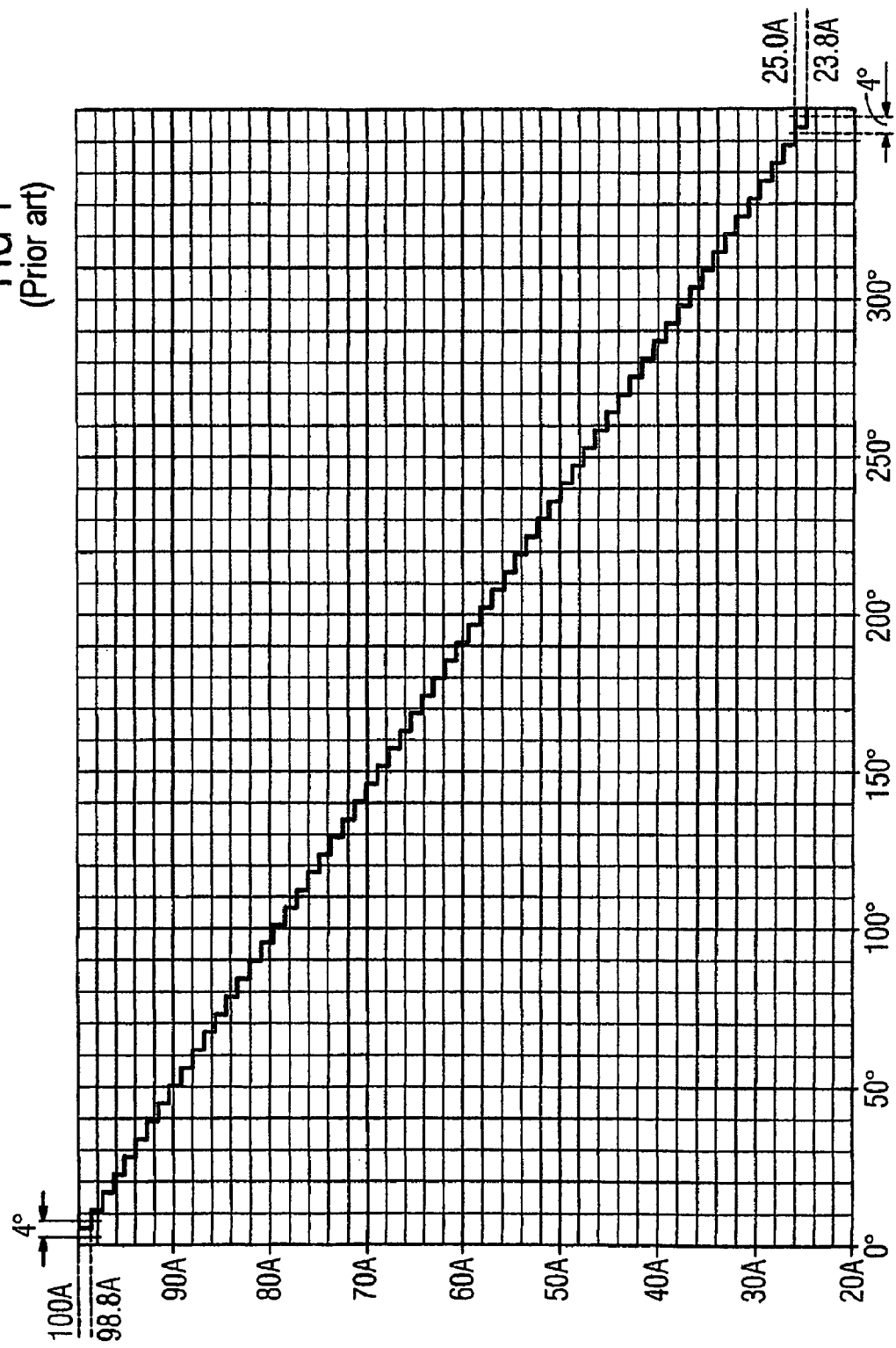
FIG. 1 shows an illustration of the setting marks and the percentage error in the case of a rotary encoding switch known from the prior art.

The prior art discloses n-stage rotary encoding switches, for example where n=16, which are distinguished by the fact that the individual switching stages are at a constant distance from one another. In the example of the depiction illustrated in FIG. 1, such a conventional rotary encoding switch is assumed, in which case use is already made of 64 switching stages in order to make it possible to better compare it with the solution according to the invention. Rotary encoding switches having 64 switching stages have hitherto not yet been disclosed.

In the case of a 64-stage rotary encoding switch with a circular encoder disk, the constant distance between each switching stage is approximately 5.63°. If such a rotary encoding switch is used as a current setting element in an overload relay, a scale with current marks and a setting arrow is required. The operation of applying the scale and the setting arrow to the rotary encoding switch is always associated with manufacturing tolerances. Experience shows that these are in the range up to +/−4°.

In the example (see FIG. 1), an overload relay has a setting range of 25 A to 100 A. The setting current would then rise by (100 A−25 A)/(64−1)=1.19 A from switching stage to switching stage. If the user wishes to set the overload relay to 25 A, it is conceivable that the 25 A mark will not be set but rather that the user will make a setting at the (25 A−1.19 A) mark. In other words, a setting error of 1.19 A with a setting value of 25 A (lower setting mark) corresponds to a percentage error of 1.19 A/25 A*100%=4.8%. However, the error is only 1.19 A/100 A*100%=1.19% at the upper setting mark (100 A). Therefore, the constant distance between the switching stages has the disadvantage that a large percentage error occurs at the lower setting mark (25 A) on account of the setting accuracy of +/−4°, whereas the percentage error is very small at the upper setting mark (100 A).

Figure 2:
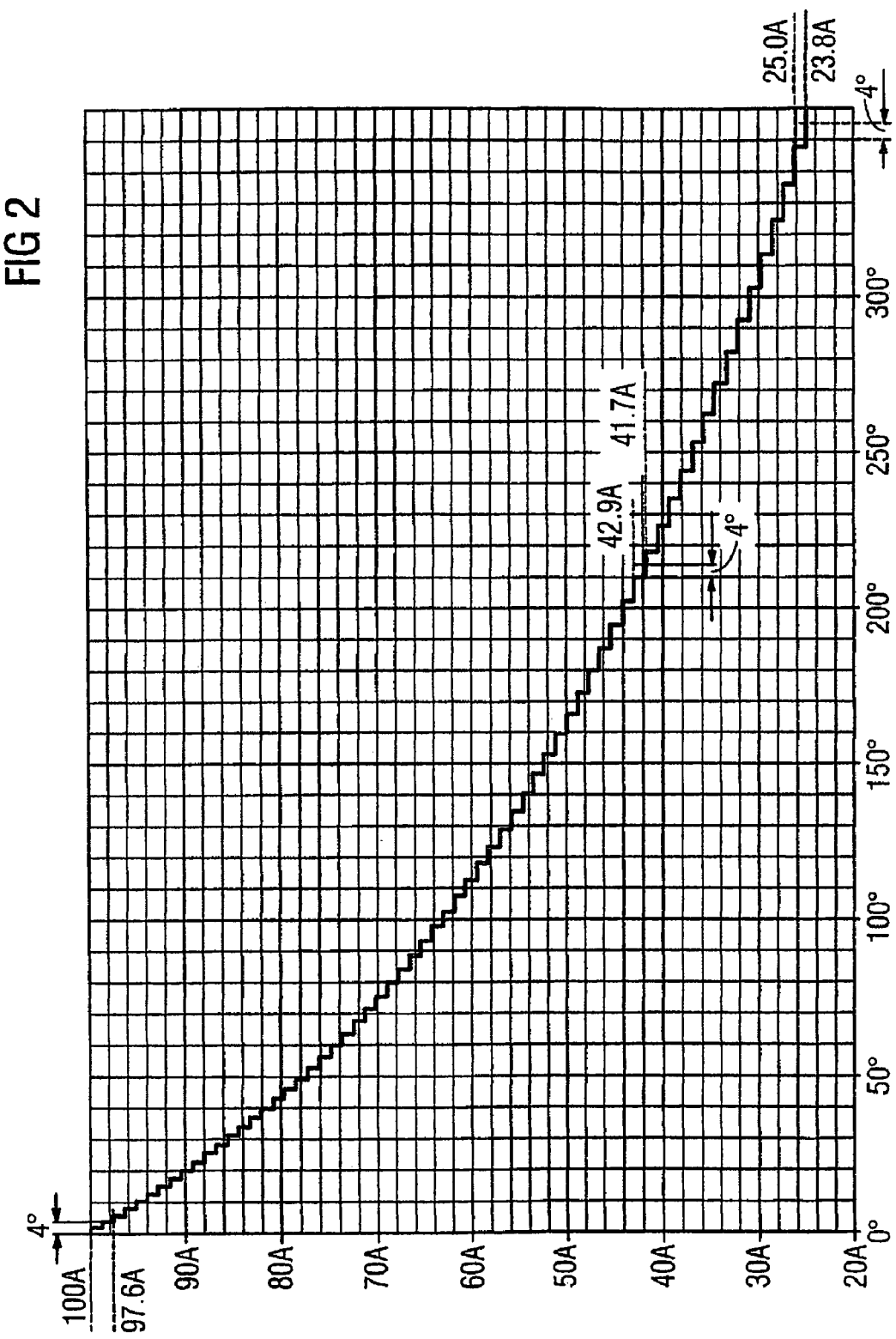
FIG. 2 shows an illustration of the setting marks and the percentage error in the case of a rotary encoding switch according to the invention.

Therefore, at least one embodiment of the invention proposes a rotary encoding switch which has a constant percentage error over the entire scale. This is achieved by virtue of the fact that the distances between the switching stages are greater at the lower setting mark (25 A) than the distances between the switching stages at the upper setting mark (100 A), where a larger setting angle error may be allowed. In particular, the distances between the individual switching stages become logarithmically ever smaller from the lower switching stage to the upper switching stage. As depicted in FIG. 2, the percentage error at the lower setting mark (25 A) is 0% in the case of such a rotary encoding switch and is 2.4% at the upper setting mark. The percentage error is greatest when the distance between one switching stage and the next becomes greater than 8° for the first time. In the example selected, this would be the case at 42.9 A. In this case, the percentage error is (42.9 A/41.7 A−1)*100%=2.9%.

As a result of the fact that the distance between the switching stages becomes logarithmically smaller, the maximum percentage error can be reduced, according to at least one embodiment of the invention, from 4.8% to 2.9% in comparison with a rotary encoding switch having a constant distance between the switching stages.

A rotary disk which has a tap is used as the encoder disk. However, in contrast to conventional resistance potentiometers, digital signals rather than resistance values are tapped off. The encoder disk is coded using conductive and non-conductive areas (illustrated in FIG. 3 in the form of black and white bars) which are scanned using a corresponding number of sensors. In this case, a conductive area represents the digital value "1" and a non-conductive area represents the digital value "0".

A Gray code (cf. FIG. 3) is used to code the encoder disk. The Gray code is a coding method for robustly transmitting digital variables. Its fundamental characteristic is that the Gray codes for two adjacent segments differ only by 1 bit. This reduces the maximum possible setting error. The Gray code is particularly suitable for a circular arrangement as on the encoder disk illustrated in FIG. 3 since only one digit changes even when changing from the highest number to 0. A table which represents the Gray code for 64 switching stages is shown in FIG. 4.

Figure 3:
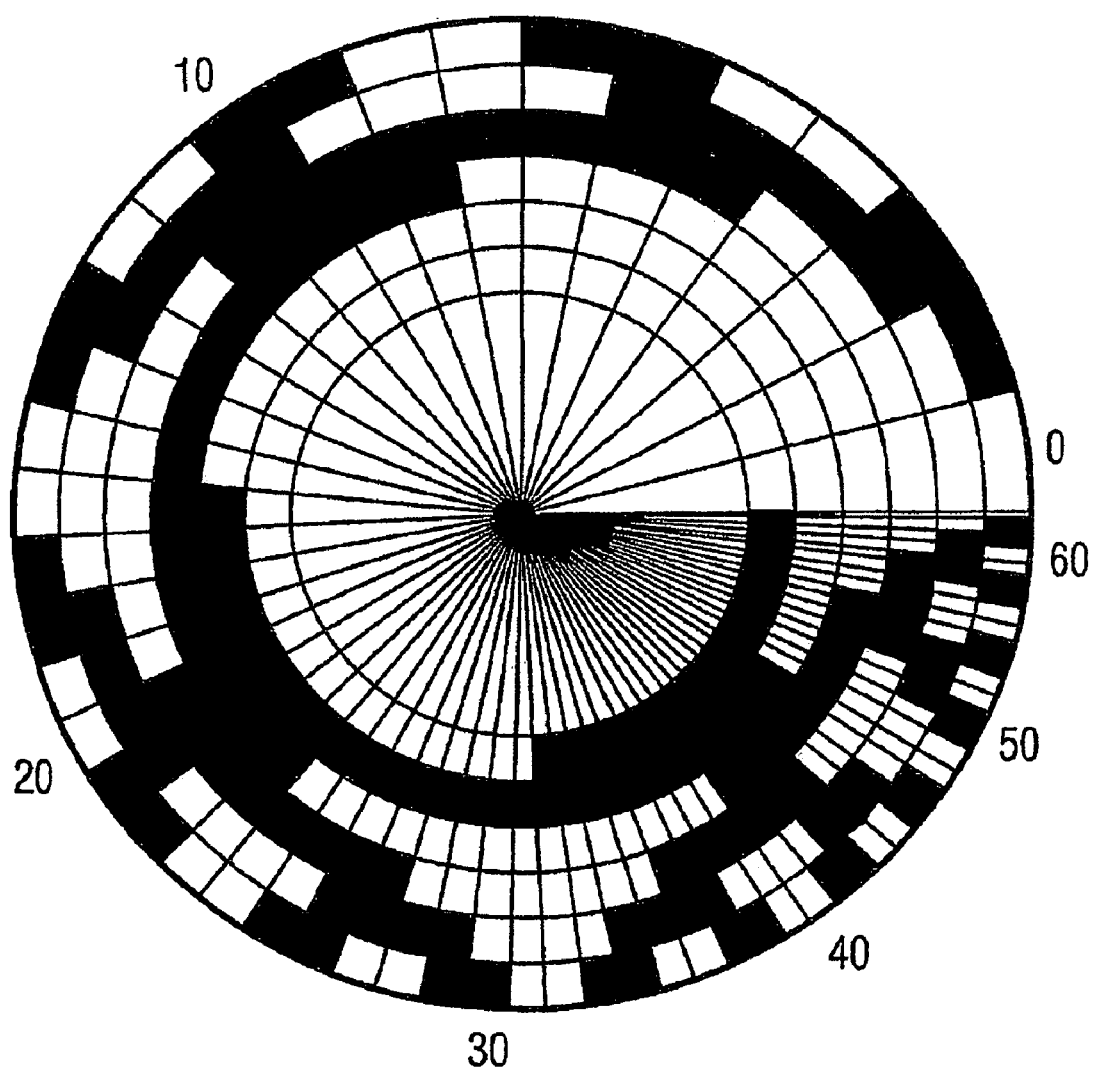
FIG. 3 shows a diagrammatic illustration of an encoder disk with Gray code.

As illustrated in FIG. 3, the distance between the individual switching stages changes, for example logarithmically, on the encoder disk. In other words, the conductive and non-conductive areas are broader in the lower switching stages (for example the switching stages 0, 1, 2 etc.) than the areas in the upper switching stages 61, 62, 63. This simultaneously means that the distances between the switching stages change. The distances between the individual switching stages decrease beginning with the low switching stages to the higher switching stages.

In this case, the following generally applies to an encoder disk having n segments:

$$360° = \sum_{v=0}^{n-1} \alpha_0 a^v$$

where $\alpha_0$ represents the angle of the segment "0" and a represents the basis for the angle calculation. The following applies to the angle of the segment "v":

$$\alpha_v = \alpha_0 a^v$$

for n=[0 . . . (n−1)]. In addition, the following applies to segment "v":

$$\log\left(\frac{\alpha_v}{\alpha_0}\right) = v \log a$$

For the example shown in FIG. 3, the following apply in this case: n=64, $\alpha_0$=2°, a=1.0289.

The use of a rotary encoding switch without latching hooks or other mechanical latching elements makes it possible to operate the rotary encoding switch in a manner corresponding to that of a resistance potentiometer. The logarithmic distribution of the switching stages simultaneously keeps the setting error low such that a high level of setting accuracy is possible. However, since solely digital signals are tapped off, there is no need for adjustment as is required in the case of a resistance potentiometer.

In other words, at least one embodiment of the invention results in a rotary encoding switch being able to assume the function of a resistance potentiometer whilst retaining the positive characteristics of the resistance potentiometer (continuous rotation, relative setting accuracy) but without having to carry out expensive and complicated adjustment.

It goes without saying that it is alternatively possible to provide the rotary encoding switch with latch positions. This is particularly expedient when the rotary encoding switch is exposed to shaking, oscillation or other vibrations. In this case, the latches are used to avoid unintentional adjustment.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A rotary encoding switch, comprising:
a rotary encoder disk, including a number of switching stages, distances between the switching stages on the rotary encoder disk varying logarithmically, the distances between the switching stages decreasing starting from the switching stages assigned relatively low setting values to the switching stages assigned relatively high setting values.

2. The rotary encoding switch as claimed in claim 1, wherein encoding of the disk includes use of a Gray code.

3. The rotary encoding switch as claimed in claim 1 wherein mechanical latch positions are absent.

4. A method, comprising:
using the rotary encoding switch as claimed in claim 1 as a current setting element in an overload relay, instead of a resistance potentiometer.

5. An overload relay, comprising:
the rotary encoding switch as claimed in claim 1, used as a current setting element instead of a resistance potentiometer.

6. The rotary encoding switch as claimed in claim 2, wherein mechanical latch positions are absent.

7. A method, comprising:
using the rotary encoding switch as claimed in claim 2 as a current setting element in an overload relay, instead of a resistance potentiometer.

8. An overload relay, comprising:
the rotary encoding switch as claimed in claim 2, used as a current setting element instead of a resistance potentiometer.

9. A method, comprising:
using the rotary encoding switch as claimed in claim 3 as a current setting element in an overload relay, instead of a resistance potentiometer.

10. An overload relay, comprising:
the rotary encoding switch as claimed in claim 3, used as a current setting element instead of a resistance potentiometer.

* * * * *